United States Patent [19]
Fujimura et al.

[11] Patent Number: 5,582,879
[45] Date of Patent: Dec. 10, 1996

[54] CLUSTER BEAM DEPOSITION METHOD FOR MANUFACTURING THIN FILM

[75] Inventors: Hidehiko Fujimura; Mitsuharu Sawamura, both of Yokohama; Makoto Kameyama, Funabashi; Akihiko Yokoyama, Yokohama, all of Japan

[73] Assignee: Canon Kabushiki Kaisha, Tokyo, Japan

[21] Appl. No.: 336,058

[22] Filed: Nov. 4, 1994

[30] Foreign Application Priority Data

Nov. 8, 1993 [JP] Japan ................................ 5-302282
Nov. 12, 1993 [JP] Japan ................................ 5-307224
Feb. 14, 1994 [JP] Japan ................................ 6-039146

[51] Int. Cl.⁶ .................................................. C23C 14/24
[52] U.S. Cl. ................ 427/561; 427/126.1; 427/126.3; 427/109; 427/166
[58] Field of Search ........................... 427/561, 523, 427/126.1, 126.3, 109, 166

[56] References Cited

FOREIGN PATENT DOCUMENTS

| | | | |
|---|---|---|---|
| 60-100669 | 4/1985 | Japan | C23C 14/32 |
| 60-100668 | 4/1985 | Japan | C23C 14/32 |
| 60-262963 | 12/1985 | Japan | C23C 14/22 |
| 62-260053 | 11/1987 | Japan | C23C 14/32 |
| 63-11662 | 1/1988 | Japan | C23C 14/32 |
| 63-029925 | 2/1988 | Japan | H01L 21/203 |
| 63-235468 | 9/1988 | Japan | C23C 14/32 |
| 63-230868 | 9/1988 | Japan | C23C 14/32 |
| 1-39370 | 2/1989 | Japan . | |
| 1-139758 | 6/1989 | Japan | C23C 14/24 |
| 2-104661 | 4/1990 | Japan | C23C 14/34 |

*Primary Examiner*—Roy V. King
*Attorney, Agent, or Firm*—Fitzpatrick, Cella, Harper & Scinto

[57] ABSTRACT

In a method of manufacturing a thin film, evaporated particles are generated by a vapor source and are clustered. The clustered evaporated particles are deposited onto a substrate in a vacuum atmosphere without ionizing the particles. A partial pressure of water in the vacuum atmoshpere is controlled to not more than $5 \times 10^{-6}$ Torr. A temperature of the substrate is maintained to be 150° C. or lower. A film according to this method has a high adhesion characteristics and a high mechanical strength without heating the substrate to a high temperature and without damaging the substrate by ions.

6 Claims, 9 Drawing Sheets

SAMPLE NAME : NCB [MgF$_2$]

CLUSTER BEAM DEPOSITION METHOD FOR MANUFACTURING THIN FILM

BACKGROUND OF THE INVENTION

1. Field of the Invention

The present invention relates to a method and apparatus for manufacturing a thin film, using a cluster beam deposition method for manufacturing a thin film with a high mechanical strength such as an adhesion, wear resistance, solvent resistance, and the like without heating a substrate to a high temperature.

2. Related Background Art

Upon manufacture of a thin film such as an optical thin film, it is a general practice to heat a substrate during film formation to increase the mechanical strength such as an adhesion, wear resistance, solvent resistance, and the like of the thin film. For example, when an anti-reflection film of $MgF_2$ as a low refractive index material is formed on a glass substrate by a resistive heating method or an electron beam irradiation heating method, the glass substrate is heated to about 300° C. to improve the adhesion, wear resistance, solvent resistance, and the like of a thin film. However, such a method of heating a substrate cannot be applied to a plastic substrate of, e.g., polymethyl methacrylate (PMMA) which causes a considerable thermal deformation when it is heated to 100° C. or higher, and a quartz substrate which deteriorates due to liberation of fluorine when it is heated to 200° C. or higher.

In place of heating a substrate, an ion assist method for applying energy by irradiating an ionized gas to evaporated particles, and a cluster ion beam method for clustering evaporated particles, and thereafter, ionizing the particles have been developed. However, with these methods, the adhesion of a thin film may be impaired in the case of a plastic substrate or the like since the ion energy considerably damages the substrate surface. Even when a film is formed on a glass substrate, a neutralizer for preventing the substrate surface from being charged is indispensable.

FIG. 1 shows a conventional cluster ion beam deposition apparatus. A sealed crucible 131 is arranged in a vacuum chamber 110 which is controlled to a predetermined vacuum pressure by a vacuum pump connected to an evacuation port 110a, a thin film material in the sealed crucible 131 is heated by a heating bombard filament 132, and a generated vapor is injected from a nozzle 131a of the sealed crucible 131 into a vacuum atmosphere to cluster the vapor form into a mass of atoms. An electron shower generated by an ionization filament 133 is irradiated onto the clustered vapor (cluster particles) to ionize at least some cluster particles. The ionized cluster particles are then accelerated by an acceleration electrode 134 to be irradiated onto a substrate $W_O$.

The above-mentioned cluster ion beam deposition method is expected to have a merit of forming a thin film having a high packing since a vapor of a thin film material is attached to a substrate as cluster particles in which a large number of atoms (normally, 1,000 atoms or more) are loosely bonded to each other. However, the surface of the substrate is damaged by bombardment of ionized cluster particles, and the optical characteristics or the like of a thin film may be impaired.

When a compound thin film is formed by supplying a reactive gas such as oxygen during film formation based on the cluster ion beam deposition method, the ionization filament for-ionizing cluster particles may deteriorate upon contact with the reactive gas. For this reason, in order to reduce contact between the reactive gas and the ionization filament by giving a directivity to the flow of reactive gas to be supplied into the vacuum chamber, the following means are proposed.

(1) means provided with a nozzle for injecting a reactive gas toward a substrate (see Japanese Laid-Open Patent Application No. 60-100668);

(2) means which uses both a nozzle for injecting a reactive gas toward a substrate, and a device for ionizing the reactive gas (see Japanese Laid-Open Patent Application No. 60-100669);

(3) means for ionizing a reactive gas by an ion source and supplying the ionized reactive gas to a vacuum chamber (see Japanese Laid-Open Patent Application No. 60-262963);

(4) means for ionizing and accelerating a reactive gas by an ionization filament together with cluster particles (see Japanese Laid-Open Patent Application No. 62-260053);

(5) means for ionizing and accelerating a reactive gas by glow discharge in a vacuum chamber (see Japanese Laid-Open Patent Application No. 63-011662);

(6) means provided with a discharging portion for exciting and activating a reactive gas in a vacuum chamber, and an orifice for injecting the activated reactive gas toward a substrate (see Japanese Laid-Open Patent Application No. 63-029925);

(7) means for ionizing and accelerating a reactive gas using an ionization device, and irradiating the ionized reactive gas onto a substrate by controlling (mass-separating or decelerating) the energy of the ionized reactive gas (see Japanese Laid-Open Patent Application No. 63-230868);

(8) means provided with a device for exciting, dissociating, or ionizing a reactive gas or a gas mixture of the reactive gas and an inert gas, a specific element, or the like near a substrate (see Japanese Laid-Open Patent Application No. 63-235468); and (9) means for converting a reactive gas into excited neutral atoms (into ozone or gas in an atomic state) by silent-discharging the reactive gas (oxygen) by a discharging tube applied with a high-frequency voltage (see Japanese Laid-Open Patent Application No. 1-139758).

Also, an ion assist method for ionizing and accelerating an inert gas by an ion source to further improve the adhesion, hardness, and the like of a thin film formed by the cluster ion beam deposition method has been developed (see Japanese Laid-Open Patent Application No. 2-104661).

However, with the above-mentioned prior arts, as described above, it is expected to have a merit of obtaining a thin film with a high packing by clustering a vapor of a thin film material, but the surface of a substrate is damaged by high-speed bombardment of ionized cluster particles on the substrate, and the optical characteristics or the like of a thin film may be impaired. When a compound thin film is formed by supplying a reactive gas, it is difficult to sufficiently prevent an ionization filament for ionizing cluster particles from deteriorating even by giving a directivity to the gas by injecting the gas from a nozzle toward a substrate, as described above. Also, when the reactive gas is ionized and accelerated by the ionization device or ion source, since the ion energy of the reactive gas is added to that of ionized cluster particles, film quality is considerably impaired by abnormal discharging on the substrate surface or charge-up (charging) of a thin film during film formation. This problem cannot be satisfactorily solved even by arranging a neutralizer for neutralizing ions near the ionization filament for ionizing cluster particles, or the ionization device or ion source for a reactive gas. Furthermore, when a so-called ion assist method for improving the adhesion or packing of a thin film by irradiating an ionized inert gas onto a substrate together with ionized cluster particles is adopted, abnormal discharging on the substrate surface and charge-up of a thin film during film formation also pose problems as in the above-mentioned methods.

In addition, the ionization device or ion source for a reactive gas, a nozzle and an orifice for injecting a reactive gas toward a substrate, and the like make the film formation apparatus complicated, and as a result, the manufacturing cost of a thin film increases.

According to the prior arts, as described above, the method of improving the adhesion, wear resistance, solvent resistance, and the like of a thin film by heating a substrate to a high temperature cannot be applied to a substrate such as a plastic substrate which causes a deformation or deterioration due to heat. On the other hand, the ion assist method or the cluster ion beam method cannot be applied to a plastic substrate, and requires a neutralizer even for a glass substrate, resulting in a complicated apparatus.

SUMMARY OF THE INVENTION

The present invention has been made in consideration of the conventional problems, and has as its object to provide a cluster beam deposition method, which allows the manufacture of a thin film with a high adhesion, wear resistance, and solvent resistance without heating a substrate to a high temperature.

In order to achieve the above object, a cluster beam deposition method according to the present invention comprises the step of clustering evaporated particles generated from a vapor source, and the step of depositing the clustered evaporated particles onto a substrate in a vacuum atmosphere without ionizing the particles.

It is preferable that the partial pressure of water in the vacuum atmosphere be controlled to be $5 \times 10^{-6}$ Torr or less.

According to the above-mentioned method, since the clustered evaporated particles are deposited on a substrate in the vacuum atmosphere without being ionized, a thin film having a high adhesion and a high mechanical strength can be manufactured without heating the substrate to a high temperature and without damaging the substrate by ions. Since the substrate need not be heated to a high temperature during film formation, the method of the present invention is particularly suited for forming a film on a plastic substrate and a fluorite substrate. Even when the method of the present invention is applied to a glass substrate, since no heat is required, a heater and a temperature control device can be omitted to simplify a film formation apparatus. Furthermore, since evaporated particles are deposited on a substrate without being ionized, the substrate is not charged. Therefore, a film formation apparatus does not require any neutralizer and the like.

When the partial pressure of water in the vacuum atmosphere is controlled to be $5 \times 10^{-6}$ Torr or less, a thin film with a higher durability can be obtained.

Furthermore, a non-ion cluster beam deposition method of the present invention can be applied to a method of manufacturing fluoride thin films such as an anti-reflection film, a polarization film, a reflection film, and the like, which consist of fluorides as thin film materials.

When a non-ion cluster beam deposition method of the present invention is used, a method of manufacturing a fluoride thin film, which can manufacture a fluoride thin film having a high adhesion and packing and free from fluorine liberation, and a fluoride thin film manufactured thereby can be provided.

A method of manufacturing a fluoride thin film of the present invention, which uses a non-ion cluster beam deposition method, comprises the step of clustering evaporated particles generated by a fluoride vapor source, and the step of depositing the clustered evaporated particles onto a substrate in a vacuum atmosphere without ionizing the particles.

It is preferable that the partial pressure of water in the vacuum atmosphere be controlled to be $5 \times 10^{-6}$ Torr or less.

Since clustered fluoride evaporated particles are deposited on a substrate in a vacuum atmosphere, the adhesion and packing with respect to a substrate are very high. Since a film is formed without ionizing the clustered evaporated particles, a thin film is free from liberation of fluorine unlike in a thin film which is formed by depositing ionized evaporated particles on a substrate. Therefore, the optical characteristics or the like of a thin film can be prevented from being impaired by liberation of fluorine. When the partial pressure of water in the vacuum atmosphere is controlled to be $5 \times 10^{-6}$ Torr or less, a fluoride thin film with a higher packing can be obtained.

Furthermore, a non-ion cluster beam deposition method of the present invention can be used together with an ion assist method.

A method of manufacturing a thin film according to the present invention, which uses a non-ion cluster beam deposition method, comprises the step of generating cluster particles of a thin film material, and the step of forming a thin film by irradiating the generated cluster particles onto a substrate together with an ion assist without ionizing the particles by ionization means.

It is preferable that the ion assist be an ionized inert gas.

The ion assist may be an ionized reactive gas or an ionized gas mixture of the reactive gas and an inert gas.

According to the above-mentioned method, since cluster particles of a thin film material are deposited on a substrate together with the ion assist, a thin film with a very high adhesion and packing can be formed even when the temperature of the substrate is relatively low. In addition, since the cluster particles are irradiated onto the substrate without being ionized, the substrate surface can be prevented from being damaged by collision energy, and the optical characteristics or the like of a thin film can be prevented from being impaired by charge-up of the thin film during film formation unlike in a case wherein cluster particles are ionized and accelerated. As a result, a thin film with a high durability, optical characteristics, and the like can be easily manufactured at a relatively low temperature.

When the method of the present invention comprises the step of generating cluster particles of a thin film material, and the step of forming a compound thin film by irradiating the generated cluster particles onto a substrate without ionizing the particles by ionization means, and supplying a reactive gas to a position near the substrate, the reactive gas need not have a directivity for the purpose of preventing corrosion of the ionization means by the reactive gas unlike in a case wherein cluster particles ionized by the ionization means are irradiated onto a substrate, resulting in a simple apparatus. In addition, the optical characteristics or the like of a thin film can be prevented from being impaired by charge-up of the thin film during film formation unlike in a case wherein a reactive gas is ionized. As a result, a compound thin film with a high durability, optical characteristics, and the like can be easily manufactured with low cost at a relatively low temperature.

BRIEF DESCRIPTION OF THE DRAWINGS

FIGS. 10A and 10B show the spectrum characteristics of the reflectivity of the 18-layered reflection film according to the sixth embodiment, in which FIG. 10A is a graph showing a change in reflectivity in a wavelength range from a wavelength of 200 nm to a wavelength of 300 nm, and FIG. 10B is an enlarged graph of a region having a reflectivity of 90% or higher in FIG. 10A;

FIGS. 11A and 11B show the spectrum characteristics of the reflectivity of a comparative example of the sixth embodiment, in which FIG. 11A is a graph showing a change in reflectivity in a wavelength range from a wavelength of 200 nm to a wavelength of 300 nm, and FIG. 11B is an enlarged graph of a region having a reflectivity of 90% or higher in FIG. 11A.

DETAILED DESCRIPTION OF THE PREFERRED EMBODIMENTS

The preferred embodiments of the present invention will be described below with reference to the accompanying drawings.

Figure 2:
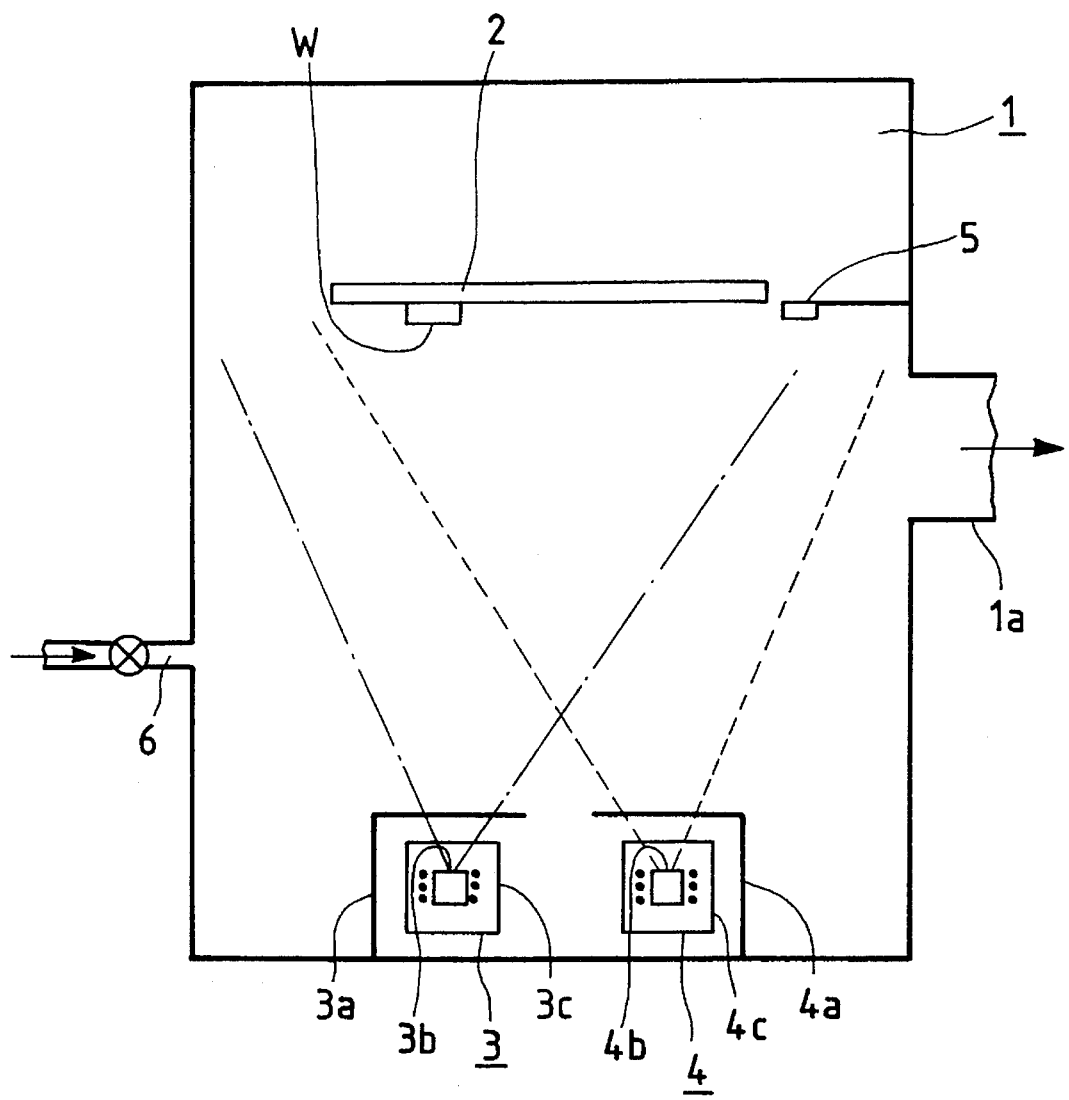
FIG. 2 is an explanatory view for explaining a film formation apparatus used in a method of manufacturing a thin film according to each of the first to third embodiments.

FIG. 2 shows a film formation apparatus used in the first to third embodiments. The film formation apparatus comprises a vacuum bath 1 as a film formation chamber, which has an evacuation port 1a and is evacuated to a high vacuum pressure by a vacuum pump (not shown) connected to the port 1a, a substrate holder 2 arranged in the bath 1, a pair of cluster beam vapor sources 3 and 4 for generating clustered evaporated particles toward a substrate W held on the holder 2, shutters 3a and 4a which can freely shield the flows of evaporated particles generated by the cluster beam vapor sources 3 and 4, a quartz monitor 5 for monitoring the film formation rate at a position near the substrate holder 2, and a reactive gas supply line 6 for supplying a reactive gas such as oxygen gas into the vacuum bath 1. The cluster beam vapor sources 3 and 4 respectively have crucibles 3c and 4c having nozzles 3b and 4b, and heaters 3d and 4d for externally heating the crucibles 3c and 4c. The cluster beam vapor sources 3 and 4 heat predetermined vapor materials as vapor sources in the crucibles 3c and 4c, inject generated evaporated particles from the nozzles 3b and 4b into a high-vacuum atmosphere, and cluster the particles by supercooling upon adiabatic expansion. The clustered evaporated particles are deposited on the substrate W while keeping an electrically neutral state without being ionized unlike in a conventional method.

(First Embodiment)

Figure 3:
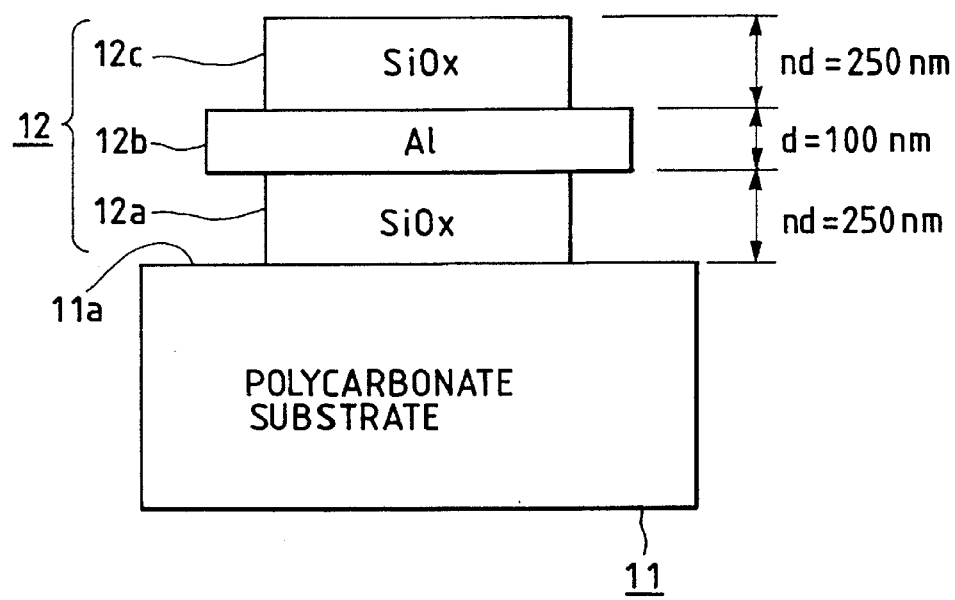
FIG. 3 is a schematic sectional view showing the film structure of a thin film formed according to the first embodiment.

Using the film formation apparatus shown in FIG. 2, a high-reflectivity film 12, which comprises a first layer 12a consisting of $SiO_x$ having an optical film thickness (nd) of 250 nm, a second layer 12b consisting of Al having a film thickness (d) of 100 nm, and a third layer 12c consisting of $SiO_x$ having an optical film thickness (nd) of 250 nm, was formed on a surface 11a of a polycarbonate substrate 11 as a low-profile plastic substrate having a diameter of 30 mm and a thickness of 1 mm, as shown in FIG. 3. The film formation of the first and third layers 12a and 12c was performed in such a manner that clustered SiO evaporated particles were generated by one of the cluster beam vapor sources 3 and 4, oxygen gas was supplied from the reactive gas supply line 6, the vacuum pressure of the vacuum bath 1 was controlled to $4 \times 10^{-5}$ Torr, and the partial pressure of water was controlled to $3 \times 10^{-6}$ Torr or less. The film formation of the second layer 12b was performed in such a manner that clustered Al evaporated particles were generated by the other one of the cluster beam vapor sources 3 and 4, and the film formation rate was controlled to 0.6 nm/sec. Note that the polycarbonate substrate 11 was not heated (150° C. or less) during film formation of the first, second, and third layers 12a, 12b, and 12c.

Figure 4:
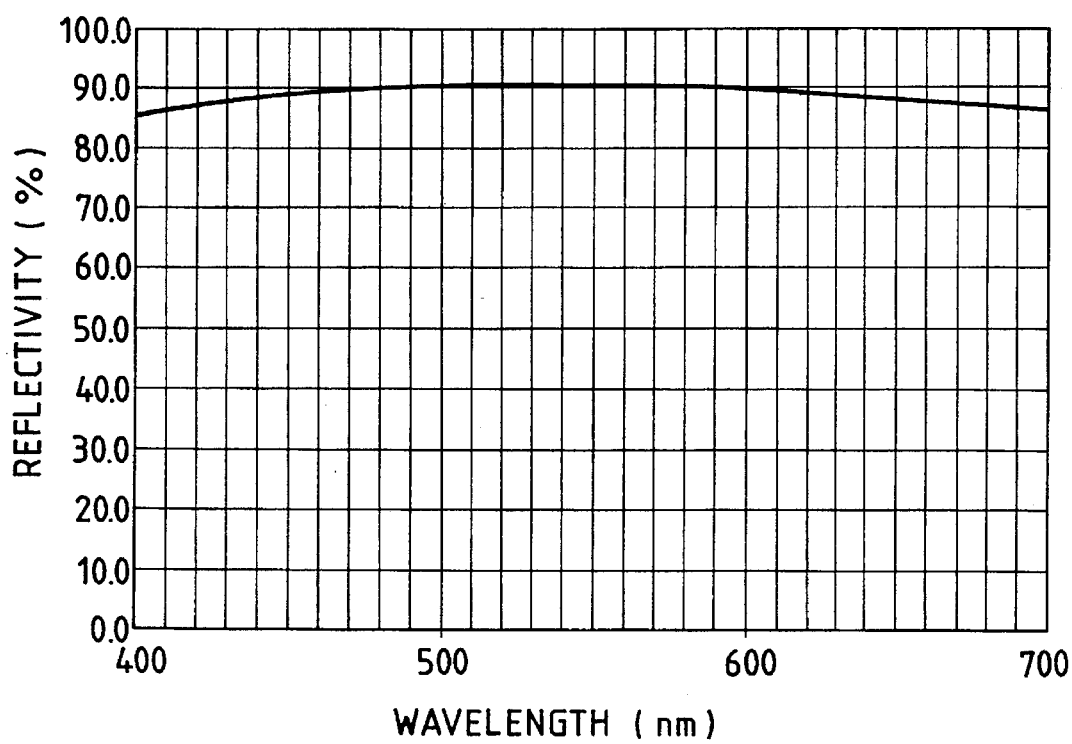
FIG. 4 is a graph showing the spectrum characteristics of reflectivity of a thin film of the first embodiment.

FIG. 4 shows the measurement results of the spectrum characteristics of the reflectivity of the high-reflectivity film 12. As can be seen from FIG. 4, the film 12 has a high reflectivity over a wide wavelength range.

Immediately after the film formation and after an environmental resistance test for 500 hours in a high-temperature/high-humidity state at a temperature of 50° C. and a humidity of 80%, the adhesion, wear resistance, and solvent resistance of the high-reflectivity film 12 were respectively evaluated by a known tape test, rubbing using Silbond paper at a load of 300 gf, and dipping into an organic solvent, and the evaluation results were good. For the purpose of comparison, Table 1 below shows the examination results of the adhesion, wear resistance, and solvent resistance immediately after the film formation and after the environmental resistance test while the high-reflectivity film of this embodiment was defined as sample A-1, a high-reflectivity film having the same film structure as that of this embodiment and formed by a known resistive heating method without heating a substrate was defined as sample B-1, and a high-reflectivity film having the same film structure as that of this embodiment and formed by the known resistive heating method by heating a substrate to 110° C. was defined as sample C-1.

TABLE 1

| Sample Name | | Prior Art | | |
|---|---|---|---|---|
| | | A-1 | B-1 | C-1 |
| Immediately After Film Formation | Adhesion | ○ | x | Δ |
| | Wear Resistance | ○ | x | Δ |
| | Solvent Resistance | ○ | x | x |
| After Environmental Resistance Test | Adhesion | ○ | x | Δ |
| | Wear Resistance | ○ | x | x |
| | Solvent Resistance | ○ | x | x |

Evaluation Criterion:
○: all products are good
Δ: some products are defective
x: all products are defective (Second Embodiment)

Using the film formation apparatus shown in FIG. 2, a 100-nm thick $MgF_2$ thin film was formed on the surface of a fluorite substrate as a substrate. During the film formation, the vacuum pressure in the vacuum bath 1 was controlled to $3 \times 10^{-6}$ Torr or less, the partial pressure of water was controlled to $2 \times 10^{-6}$ Torr or less, and the film formation rate was controlled to 1 nm/sec. In addition, the fluorite substrate was not heated (150° C. or less). The formed $MgF_2$ thin film were measured for its absorbancy at a wavelength of 400 nm and its refractive index at a wavelength of 500 nm, and its surface roughness was evaluated using an interference roughness meter. For the purpose of comparison, the same evaluations as described above were performed while the $MgF_2$ thin film of this embodiment was defined as sample A-2, and an $MgF_2$ thin film obtained by forming the same film as in this embodiment on the surface of a fluorite substrate by heating the substrate to 200° C. by the resistive heating method was defined as B-2, and the evaluation results are summarized in Table 2 below.

TABLE 2

| Sample Name | Absorbancy (%) | Refractive Index | Surface Roughness (nm) |
|---|---|---|---|
| A-2 | 0.1 | 1.391 | 1.1 |
| B-2 | 0.2 | 1.381 | 2.0 |

As can be understood from Table 2, the absorbancy, refractive index, and denseness of the thin film of this embodiment are superior to those of a film obtained by heating the substrate by the resistive heating method.

It was found that the examination results of the adhesion, wear resistance, and solvent resistance immediately after the film formation and after the environmental resistance test as in the first embodiment were very good in the case of the thin film of this embodiment, while the wear resistance of the sample B-2 was poor.

Table 3 below shows the measurement results of the absorbancies at wavelengths 248 nm, 400 nm, and 500 nm from the ultraviolet range to the visible light range while a thin film obtained by forming a 44-nm thick $MgF_2$ film on a quartz substrate by the cluster beam deposition method under the same film formation condition as described above was defined as sample C-2, and thin films obtained by forming the same $MgF_2$ films by an electron gun heating method and a cluster ion beam method were defined as samples D-2 and E-2. Note that substrates were not heated during film formation of samples C-2, D-2, and E-2.

TABLE 3

| Sample Name | Wavelength = 248 nm | Wavelength = 400 nm | Wavelength = 500 nm |
|---|---|---|---|
| C-2 | 0.21 | 0.10 | 0 or less |
| D-2 | 0.82 | 0.21 | 0.1 or less |
| E-2 | 1.27 | 0.24 | 0.1 or less |

As can be seen from Table 3, the thin film (sample C-2) formed by the cluster beam deposition methods has smaller absorbancies at all wavelengths than those of the thin films formed by other methods, and its absorbancy is greatly reduced especially at wavelengths in the ultraviolet range.

(Third Embodiment)

Using the film formation apparatus shown in FIG. 2, a 50m-nm thick ZnS thin film was formed on the surface of a BK7 glass substrate as a substrate. During the film formation, the substrate was not heated (150° C. or less), the vacuum pressure in the vacuum bath 1 was controlled to $6 \times 10^{-6}$ Torr, the partial pressure of water was controlled to $5 \times 10^{-6}$ Torr, and the film formation rate was controlled to 0.5 nm/sec. The examination results of the adhesion, wear resistance, and solvent resistance of the formed ZnS thin film immediately after the film formation and after the same environmental resistance test as in the first embodiment were very good. For the purpose of comparison, Table 4 below shows the examination results of the adhesion, wear resistance, and solvent resistance immediately after the film formation and after the environmental resistance test by preparing three ZnS thin films as samples A-3, B-3, and D-3 following substantially the same film formation conditions as in this embodiment, except that the partial pressure of water and the pressure in the vacuum bath (shown below in parentheses) were respectively controlled to $1 \times 10^{-6}$ Torr ($1.1 \times 10^{-5}$ Torr), $8 \times 10^{-6}$ Torr ($9 \times 10^{-6}$ Torr), and $2 \times 10^{-6}$ Torr ($3 \times 10^{-6}$ Torr), and defining the thin film of this embodiment as sample C-3.

TABLE 4

| Sample Name | | A-3 | B-3 | C-3 | D-3 |
|---|---|---|---|---|---|
| Partial Pressure of Water Upon Film Formation (Torr) | | $1 \times 10^{-5}$ | $8 \times 10^{-6}$ | $5 \times 10^{-6}$ | $2 \times 10^{-6}$ |
| Immediately After Film Formation | Adhesion | ○ | ○ | ○ | ○ |
| | Wear Resistance | ○ | ○ | ○ | ○ |
| | Solvent Resistance | ○ | ○ | ○ | ○ |
| After Environmental Resistance Test | Adhesion | Δ | Δ | ○ | ○ |
| | Wear Resistance | Δ | Δ | ○ | ○ |
| | Solvent Resistance | x | Δ | ○ | ○ |

As can be seen from Table 4, in the cluster beam deposition method in which evaporated particles are clustered, and are deposited onto the substrate in an electrically neutral state without being ionized, the partial pressure of water upon film formation largely influences the adhesion and denseness of a thin film, and in order to obtain a thin film with a high adhesion, wear resistance, and solvent resistance, the partial pressure of water upon film formation is preferably controlled to $5 \times 10^{-6}$ Torr or less.

The thin film manufacturing apparatus of the present invention described above has the following arrangement.

The vacuum bath 1 includes the cluster beam vapor sources 3 and 4 for heating and evaporating vapor materials in the crucibles 3c and 4c, and clustering the evaporated particles by injecting the generated evaporated particles from the nozzles 3b and 4b into a vacuum. The clustered evaporated particles are deposited on the substrate W in an electrically neutral state without being ionized. Thus, a thin film with a sufficiently high adhesion, wear resistance, and solvent resistance can be manufactured without heating the substrate W to a high temperature.

Since the present invention has the above-mentioned arrangement, the following effects are expected.

A thin film with a sufficiently high adhesion, wear resistance, and solvent resistance can be manufactured without heating a substrate to a high temperature. Since the thin film is free from damage of ions, film formation especially for a plastic substrate, fluorite substrate, and the like is easy, and since no neutralizer is used, the film formation apparatus can be simplified.

Other embodiments of the present invention will be described below with reference to the accompanying drawings.

Figure 5:
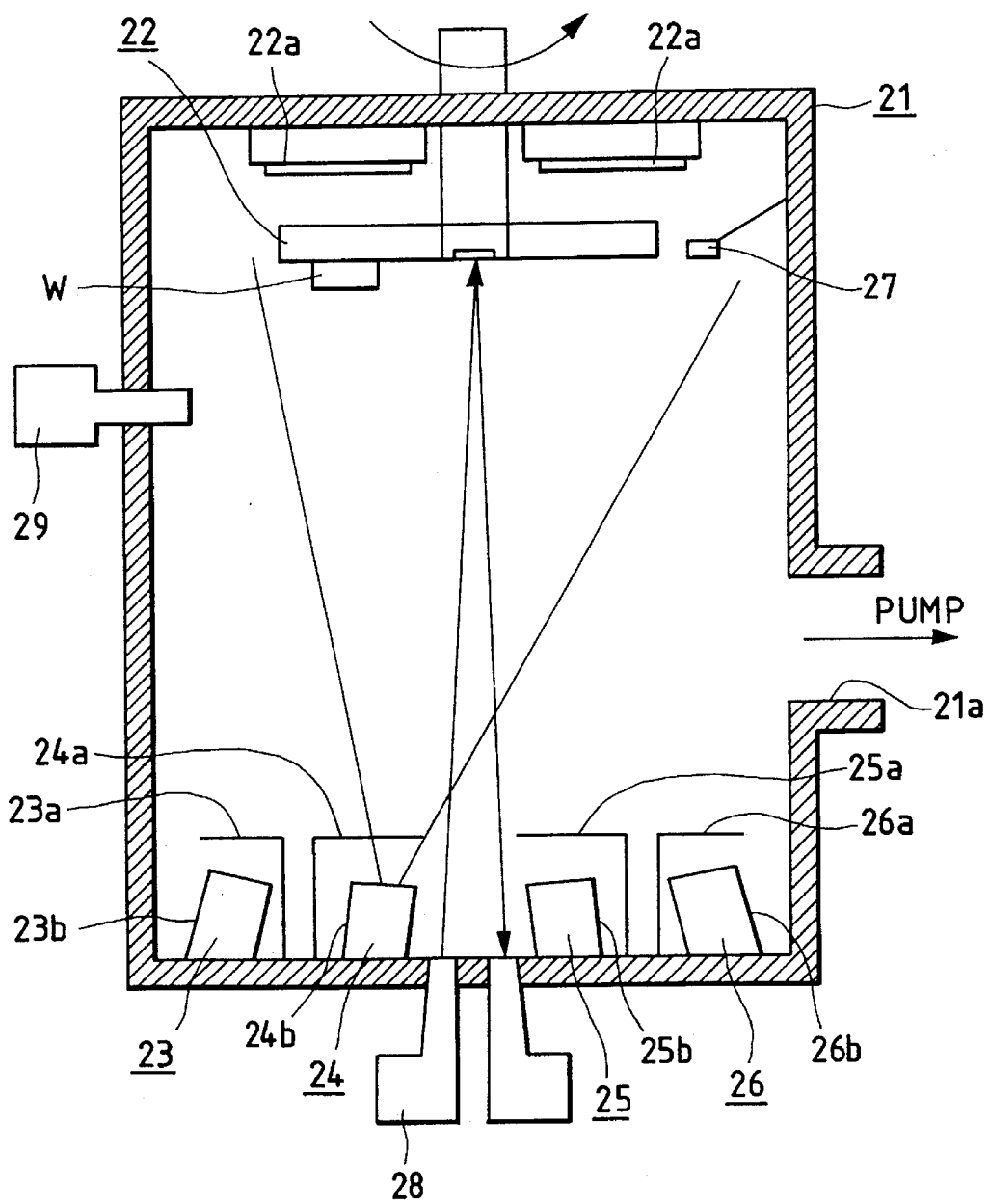
FIG. 5 is an explanatory view for explaining a film formation apparatus used in the fourth to sixth embodiments.

FIG. 5 shows a film formation apparatus used in a method of manufacturing a fluoride thin film based on a film formation method (to be referred to as a "non-ion cluster beam deposition method" hereinafter) according to the fourth to sixth embodiments. The apparatus comprises a vacuum chamber 21 which has an evacuation port 21a and is evacuated to a high vacuum pressure by a vacuum pump (not shown) connected to the port 21a, a substrate holder 22 arranged in the chamber 21, first to fourth cluster beam vapor sources 23 to 26 for generating clustered evaporated particles toward a substrate W held by the holder 22, shutters 23a to 26a which can freely shield the flows of evaporated particles generated from the cluster beam vapor sources 23 to 26, a quartz monitor 27 for monitoring the film formation rate at a position near the substrate holder 22, an optical monitor 28 for detecting the film thickness of a thin film formed on the substrate W, and a Q mass spectrum analyzer 29 for measuring the partial pressure of water in a vacuum atmosphere of the vacuum chamber 21. A heater 22a for heating the substrate W is arranged on the rear side of the substrate holder 22 as needed. The cluster beam vapor sources 23 to 26 heat predetermined fluoride vapor sources in sealed crucibles 23b to 26b having nozzles (not shown), inject generated evaporated particles from the nozzles into a high-vacuum atmosphere, and cluster the evaporated particles by supercooling upon adiabatic expansion. The clustered evaporated particles are deposited on the substrate W in an electrically neutral state without being ionized.

(Fourth Embodiment)

Figure 6:
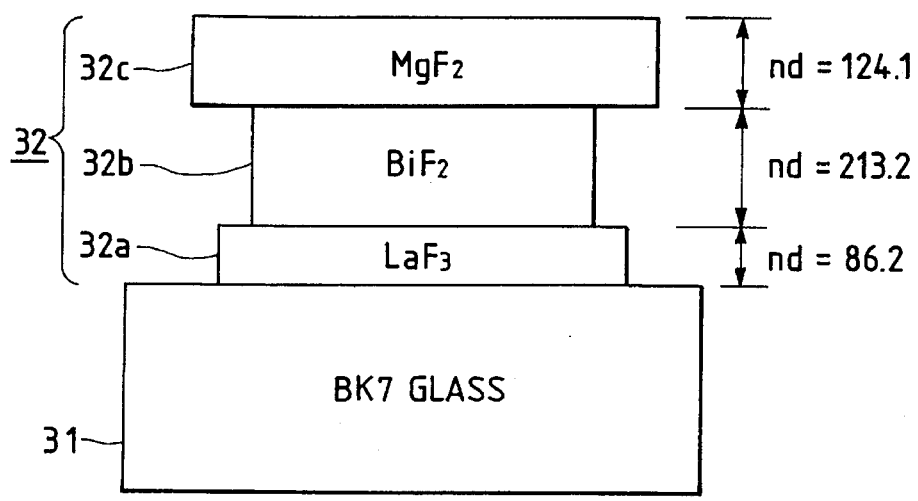
FIG. 6 is a schematic sectional view showing a three-layered anti-reflection film according to the fourth embodiment.

Using the film formation apparatus shown in FIG. 5, a three-layered anti-reflection film 32 having a first layer 32a consisting of $LaF_3$ having an optical film thickness of 86.2 nm, a second layer 32b consisting of $BiF_2$ having an optical film thickness of 213.2 nm, and a third layer 32c consisting of $MgF_2$ having an optical film thickness of 124.1 nm was formed on the surface of a BK7 glass substrate 31 having a diameter of 30 mm and a thickness of 1 mm, as shown in FIG. 6. During film formation, the pressure in the vacuum chamber 21 was controlled to $5 \times 10^{-6}$ Torr or less, the film formation rate of the first layer 32a was 1.1 nm/sec, the film formation rate of the second layer 32b was 1.0 nm/sec, the film formation rate of the third layer 32c was 1.3 nm/sec, and the substrate 31 was not heated (room temperature). Note that the optical film thickness (nd) was calculated using a refractive index at a wavelength of 500 nm.

Figure 7:
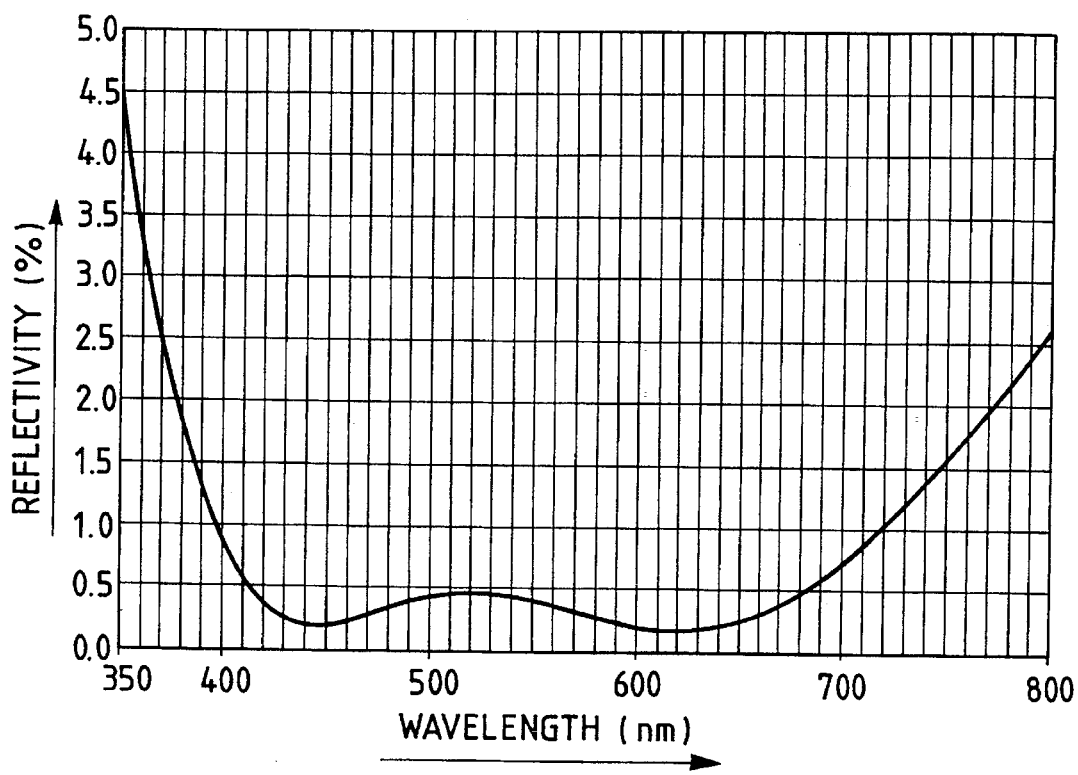
FIG. 7 is a graph showing the spectrum characteristics of reflectivity of the three-layered anti-reflection film according to the fourth embodiment.

The spectrum characteristics of the reflectivity of the three-layered anti-reflection film 32 are as shown in FIG. 7, and as can be seen from FIG. 7, the film 32 has high anti-reflection characteristics over a wide wavelength range. Immediately after the film formation, after an environmental resistance test for 100 hours in a high-temperature/high-humidity state (70° C., 85%), and after an environmental resistance test for 500 hours in the same high-temperature/high-humidity state, the adhesion, wear resistance, and solvent resistance of the three-layered anti-reflection film 32 were respectively evaluated by known tape test, rubbing using Silbond paper, and dipping into an organic solvent, and the evaluation results were good. When the spectrum characteristics of the reflectivity were measured after the above-mentioned environmental resistance test, and were compared with those before the environmental resistance test, the wavelength shift was very small. For the purpose of comparison, Table 5 below shows the examination results of the adhesion, wear resistance, solvent resistance, and wavelength shift immediately after the film formation and after the two environmental resistance tests by the same methods as described above while the three-layered anti-reflection film 32 of this embodiment was defined as sample $F_1$, films formed under substantially the same film formation conditions as those in this embodiment, except that substrates were respectively heated to 100° C., 200° C., and 300° C., were defined as samples $G_1$, $H_1$, and $I_1$, and three-layered anti-reflection films which had the same film structure as that of the three-layered anti-reflection film of this embodiment and were formed by an electron gun heating method while controlling the temperatures of substrates during film formation to room temperature, 100° C., 200° C., and 300° C., were defined as samples $J_1$, $K_1$, $L_1$, and $M_1$.

TABLE 5

| | Sample Name | Electron Gun Heating Method | | | | Non-ion Cluster Beam Method | | | |
|---|---|---|---|---|---|---|---|---|---|
| | | $J_1$ | $K_1$ | $L_1$ | $M_1$ | $F_1$ | $G_1$ | $H_1$ | $I_1$ |
| | (1) Immediately After Film Formation | | | | | | | | |
| Evaluation Result | Adhesion | Δ | Δ | ○ | ○ | ○ | ○ | ○ | ○ |
| | Wear Resistance | x | Δ | ○ | ○ | ○ | ○ | ○ | ○ |
| | Solvent Resistance | x | Δ | ○ | ○ | ○ | ○ | ○ | ○ |
| | 500 nm Loss (%) | 0.5 | 0.4 | 0.4 | 0.4 | 0.1 | 0.2 | 0.2 | 0.2 |

TABLE 5-continued

|  | | Electron Gun Heating Method | | | | Non-ion Cluster Beam Method | | | |
|---|---|---|---|---|---|---|---|---|---|
|  | Sample Name | $J_1$ | $K_1$ | $L_1$ | $M_1$ | $F_1$ | $G_1$ | $H_1$ | $I_1$ |
|  | (2) After 100-Hr Environmental Resistance Test | | | | | | | | |
| Evaluation Result | Adhesion | x | Δ | o | o | o | o | o | o |
|  | Wear Resistance | x | x | Δ | o | o | o | o | o |
|  | Solvent Resistance | x | x | Δ | o | o | o | o | o |
|  | Wavelength Shift | +12 | +8 | +6 | +5 | +1 | <1 | <1 | <1 |
|  | (3) After 500-Hr Environmental Resistance Test | | | | | | | | |
| Evaluation Result | Adhesion | x | x | Δ | o | o | o | o | o |
|  | Wear Resistance | x | x | x | Δ | o | o | o | o |
|  | Solvent Resistance | x | x | x | o | o | o | o | o |
|  | Wavelength Shift (nm) | NG | +13 | +8 | +7 | +1 | <1 | <1 | <1 |

Evaluation Criterion
o: no defective samples
Δ: some samples are defective
x: all samples are defective As can be seen from Table 5, when the non-ion cluster beam method is adopted, even when the substrate is not heated during film formation, the adhesion and packing of a formed anti-reflection film are almost the same as those of a film obtained by heating a substrate, and the anti-reflection film formed by the non-ion cluster beam method is totally superior to a film formed by the conventional electron gun heating method. Furthermore, as can be also seen from FIG. 5, even when the substrate is heated to a temperature as high as 300° C., the film formed by the electron gun heating method has considerably lower optical characteristics and wear resistance after the environmental resistance test for 500 hours than those of the anti-reflection film formed by the non-ion cluster beam method.

(Fifth Embodiment)

A plurality of BK7 glass substrates each having a diameter of 30 mm and a thickness of 3 mm were held by the substrate holder 22 of the film formation apparatus shown in FIG. 5, and an $MgF_2$ single-layered film having an optical film thickness of 125 nm was deposited on each substrate. During the film formation, each substrate was not heated (room temperature), the film formation rate was 1 nm/sec, and the partial pressure of water was controlled to $5\times10^{-6}$ Torr. As a result of examination of the adhesion, wear resistance, and solvent resistance immediately after the film formation and after an environmental resistance test for 500 hours in a high-temperature/high-humidity state (70° C., 85%) by the same method as in the fourth embodiment, the adhesion, wear resistance, and solvent resistance were good, and changes between the refractive indices immediately after the film formation and after the environmental resistance test were very small. For the purpose of comparison, Table 6 below shows examination results of the adhesion, wear resistance, solvent resistance, and refractive index immediately after the film formation and after the environmental resistance test for 500 hours while the $MgF_2$ single-layered film of this embodiment was defined as sample $I_2$, and $MgF_2$ single-layered films which were formed following substantially the same procedures as in this embodiment, except that the partial pressures of water were respectively set to be $2\times10^{-5}$ Torr, $1\times10^{-5}$ Torr, $8\times10^{-6}$ Torr, $3\times10^{-6}$ Torr, and $1\times10^{-6}$ Torr, were defined as samples $F_2$, $G_2$, $H_2$, $J_2$, and $K_2$.

TABLE 6

Substrate: BK7 Film Type: $MgF_2$

| | | Immediately After Film Formation | | | | After 500-Hr Environmental Resistance Test at High Temperature and High Humidity (70° C., 85%) | | | |
|---|---|---|---|---|---|---|---|---|---|
| Sample Name | Partial Pressure of Water (Torr) | Adhesion | Wear Resistance | Solvent Resistance | Change in Refractive Index (Wavelength: 500 nm) | Adhesion | Wear Resistance | Solvent Resistance | Change in Refractive Index (Wavelength: 500 nm) |
| $F_2$ | $2\times10^{-5}$ | o | o | o | 1.393 | o | x | x | +0.007 |
| $G_2$ | $1\times10^{-5}$ | o | o | o | 1.391 | o | Δ | x | +0.006 |
| $H_2$ | $8\times10^{-6}$ | o | o | o | 1.390 | o | o | Δ | +0.006 |
| $I_2$ | $5\times10^{-6}$ | o | o | o | 1.389 | o | o | o | +0.004 |
| $J_2$ | $3\times10^{-6}$ | o | o | o | 1.388 | o | o | o | +0.002 |
| $K_2$ | $1\times10^{-6}$ | o | o | o | 1.386 | o | o | o | 0 |

Evaluation Criterion:
o: no defective sample
Δ: some samples are defective
x: all samples are defective As can be seen from Table 6, when the partial pressure of water during the film formation is $5\times10^{-6}$ Torr or less, the adhesion, wear resistance, and solvent resistance immediately after the film formation and after the environmental resistance test are good, and changes in refractive index are 0.005 or less, i.e., the thin film has very stable optical characteristics. When the partial pressure of water during film formation is $8\times10^{-6}$ Torr or more, the adhesion, wear resistance, and solvent resistance after the environmental resistance test are lowered, and changes in refractive index are large. It is estimated that if the partial pressure of water is high, water is mixed in cluster evaporated particles to be deposited on the substrate, and the packing of the thin film is lowered. Note that the same samples were manufactured for thin films consisting of fluorides other than $MgF_2$, e.g., $LaF_3$, $LiF$, $NdF_3$, $BaF_2$, $SrF_2$, $NaF$, $AlF_3$, $Na_3AlF_6$, and the like, the same experiments were conducted, and substantially the same results as described above were obtained.

Figure 8:
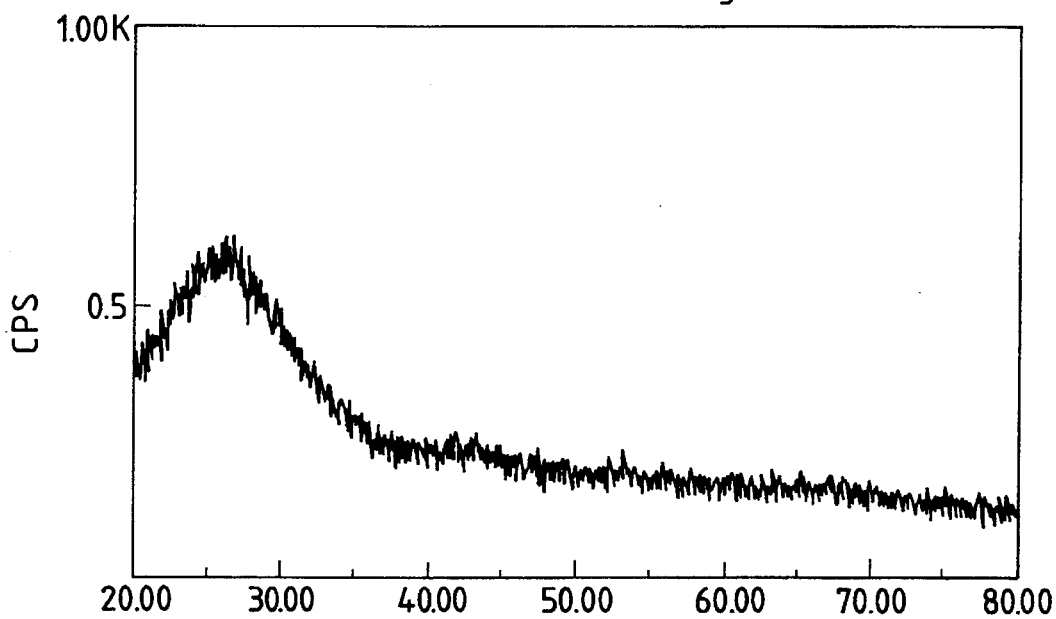
FIG. 8 is a graph showing the analysis results of an $MgF_2$ single-layered film of the fifth embodiment by an X-ray diffraction method.

FIG. 8 shows the examination results of the crystal structure of the $MgF_2$ single-layered film of this embodiment by an X-ray diffraction method. Since no peak representing the presence of a crystal was observed in FIG. 8, it was found that the $MgF_2$ single-layered film of this embodiment was an amorphous film.

(Sixth Embodiment)

Figure 9:
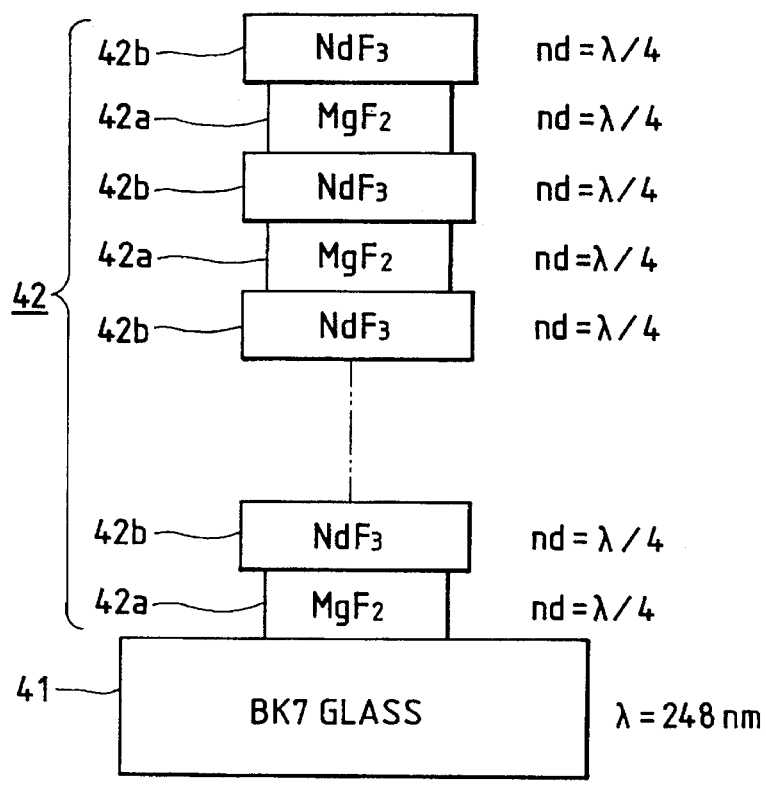
FIG. 9 is a schematic sectional view showing an 18-layered reflection film according to the sixth embodiment.

Using the film formation apparatus shown in FIG. 5, an 18-layered reflection film 42 on which nine $MgF_2$ thin films 42a and nine $NdF_3$ thin films 42b were alternately stacked was formed on the surface of a BK7 glass substrate 41 having a diameter of 40 mm and a thickness of 3 mm, as shown in FIG. 9. This reflection film was one for an excimer laser having a wavelength of 248 nm. Each $MgF_2$ film 42a had an optical film thickness (nd) of 62 nm, and was formed under film formation conditions that the partial pressure of water was $5\times10^{-6}$ Torr or less, and the film formation rate was 1.0 nm/sec. Each $NdF_3$ thin film 42b had an optical film thickness (nd) of 62 nm, and was formed under film formation conditions that the partial pressure of water was $5\times10^{-6}$ Torr or less, and the film formation rate was 0.8 nm/sec. During formation of these films, the substrate was not heated (room temperature).

Figure 10A:
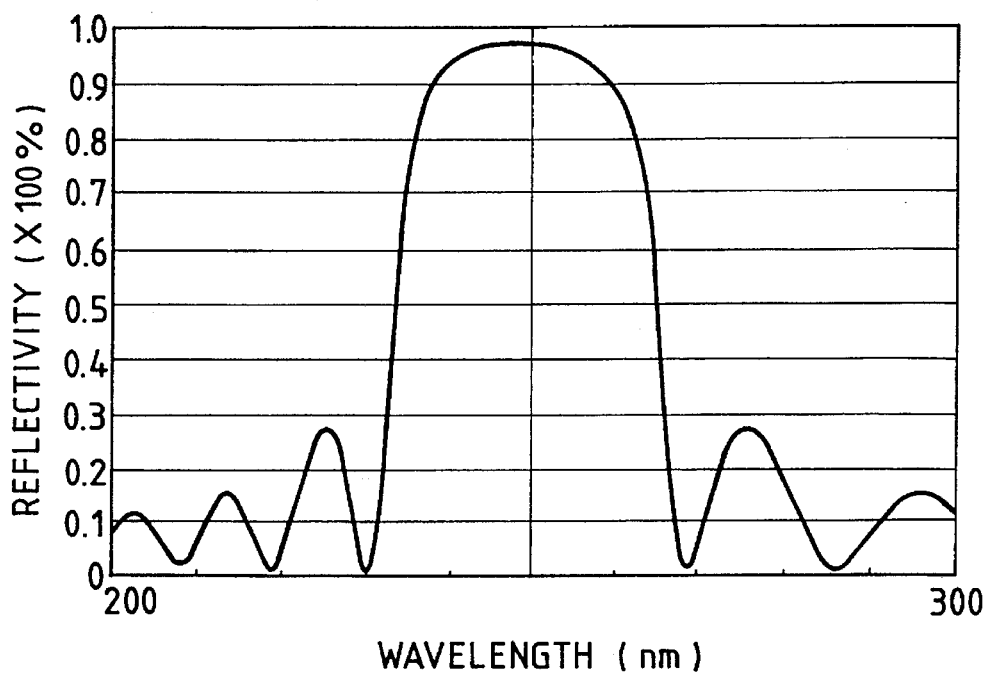
Figure 10B:
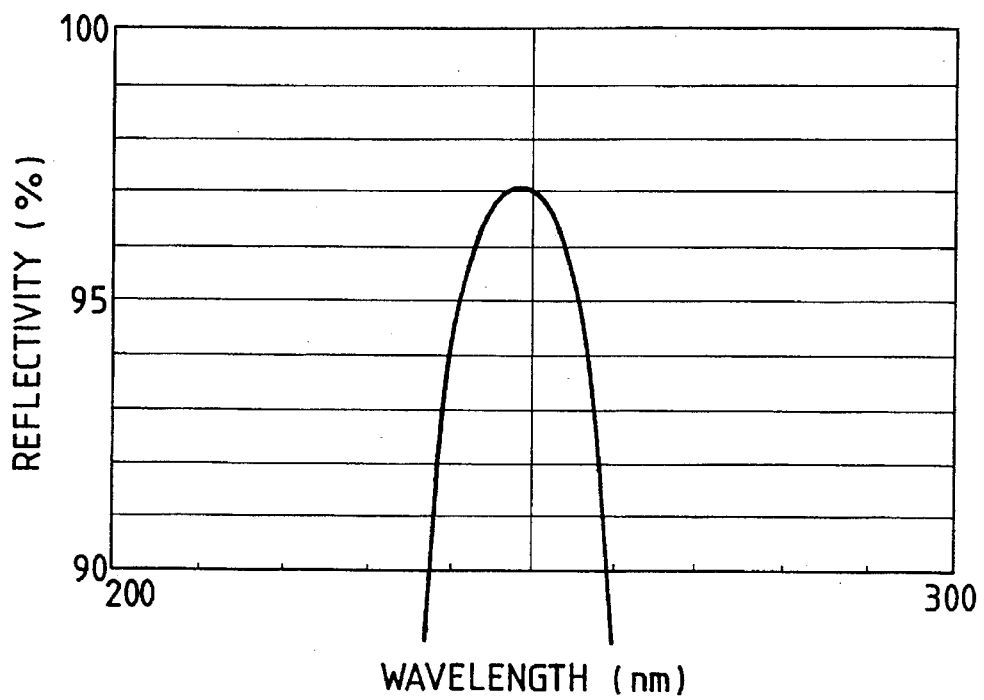

FIG. 10A is a graph showing the measurement results of the spectrum characteristics of the reflectivity of the 18-layered reflection film 42 of this embodiment, and FIG. 10B is an enlarged graph of a region having a reflectivity of 90% or higher in FIG. 10A. When the spectrum characteristics of the reflectivity were examined after $10^8$ shots of excimer laser light of 300 pulses/s were irradiated onto the 18-layered reflection film 42 of this embodiment at a power density of 50 mJ/cm$^2$, substantially the same results as those shown in FIGS. 10A and 10B were obtained. This reveals that the reflection film of this embodiment has a very high packing and high optical stability.

Figure 11A:
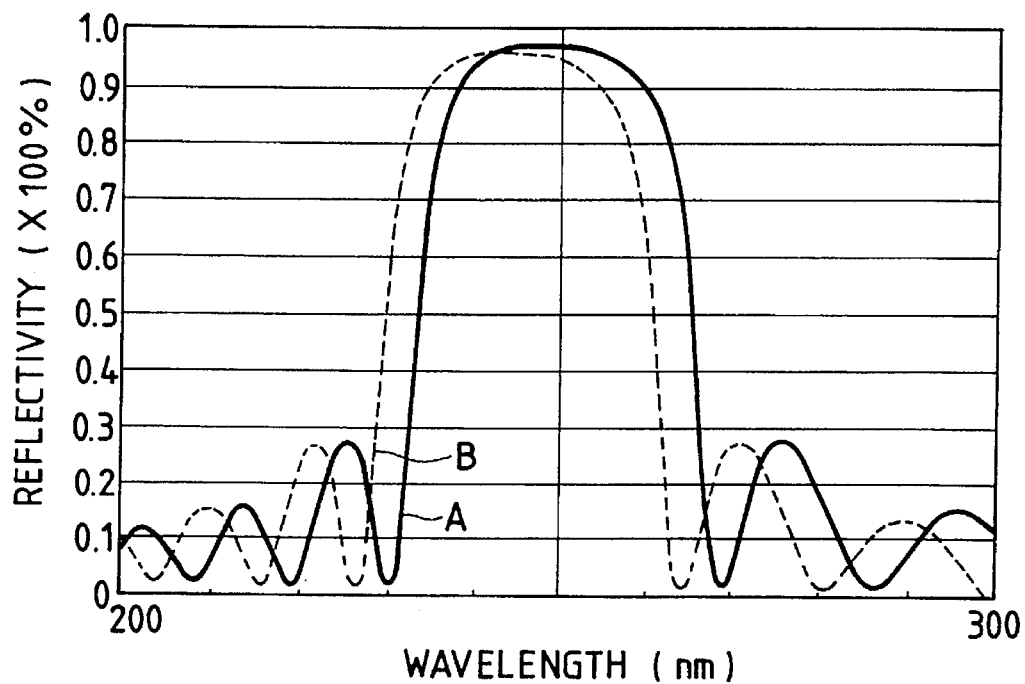
Figure 11B:
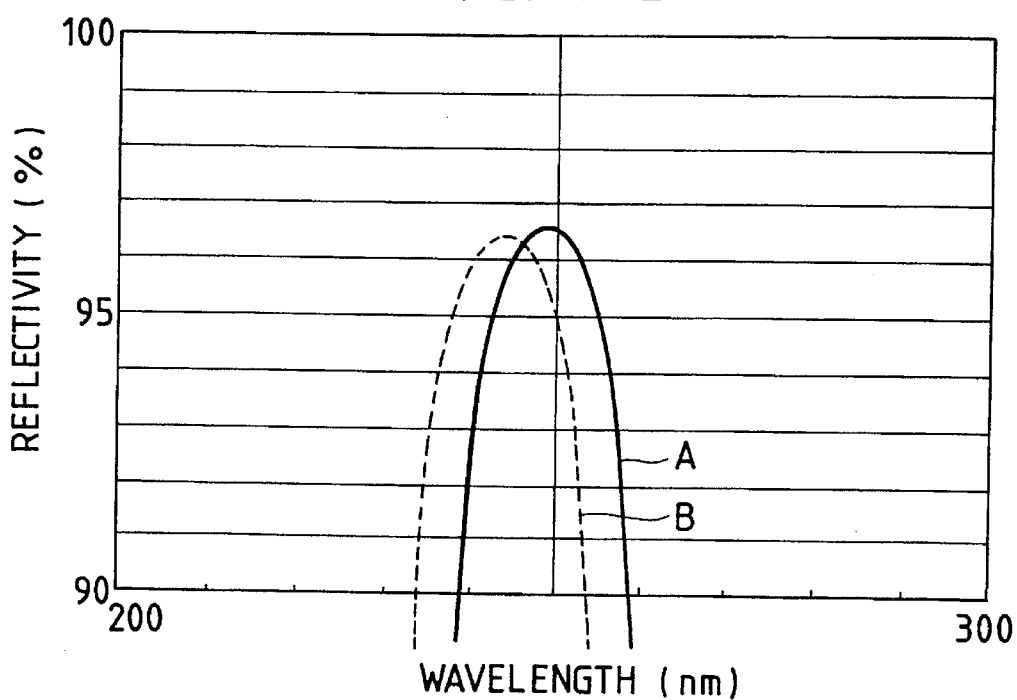

For the purpose of comparison, when an 18-layered reflection film having the same structure as in this embodiment was prepared by heating a substrate to 300° C. by an electron gun heating method, the examination results of the spectrum characteristics of the reflectivity of this film were as indicated by a curve A in FIGS. 11A and 11B, and the examination results of the spectrum characteristics of the reflectivity after the same laser durability test as described above were as indicated by a curve B in FIGS. 11A and 11B. As can be seen from FIGS. 11A and 11B, the center wavelength of the spectrum characteristics after the laser durability test is shifted by 5 nm toward the short wavelength side. More specifically, it is estimated that since a film manufactured by the electron gun heating method has a low packing, and water mixed in a thin film is removed from the thin film during the laser durability test, the refractive index was lowered.

The thin film apparatus of the present invention described above has the following arrangement.

The interior of the vacuum chamber 21 is evacuated to a predetermined high vacuum pressure, and the partial pressure of water is controlled to $5\times10^{-6}$ Torr or less. Fluoride evaporated particles are generated by at least one of the cluster beam vapor sources 23 to 26 so as to be clustered, and the clustered evaporated particles are deposited on a substrate W in an electrically neutral state without being ionized. The formed fluoride thin film is an amorphous film, has a high adhesion and packing, and is free from liberation of fluorine.

Since the present invention has the above-mentioned arrangement, the following effects are expected.

A fluoride thin film, which has a high adhesion and packing, is free from liberation of fluorine, and hence, has high durability, optical characteristics, and the like, can be manufactured.

Still other embodiments of the present invention will be described below with reference to the accompanying drawings.

Figure 12:
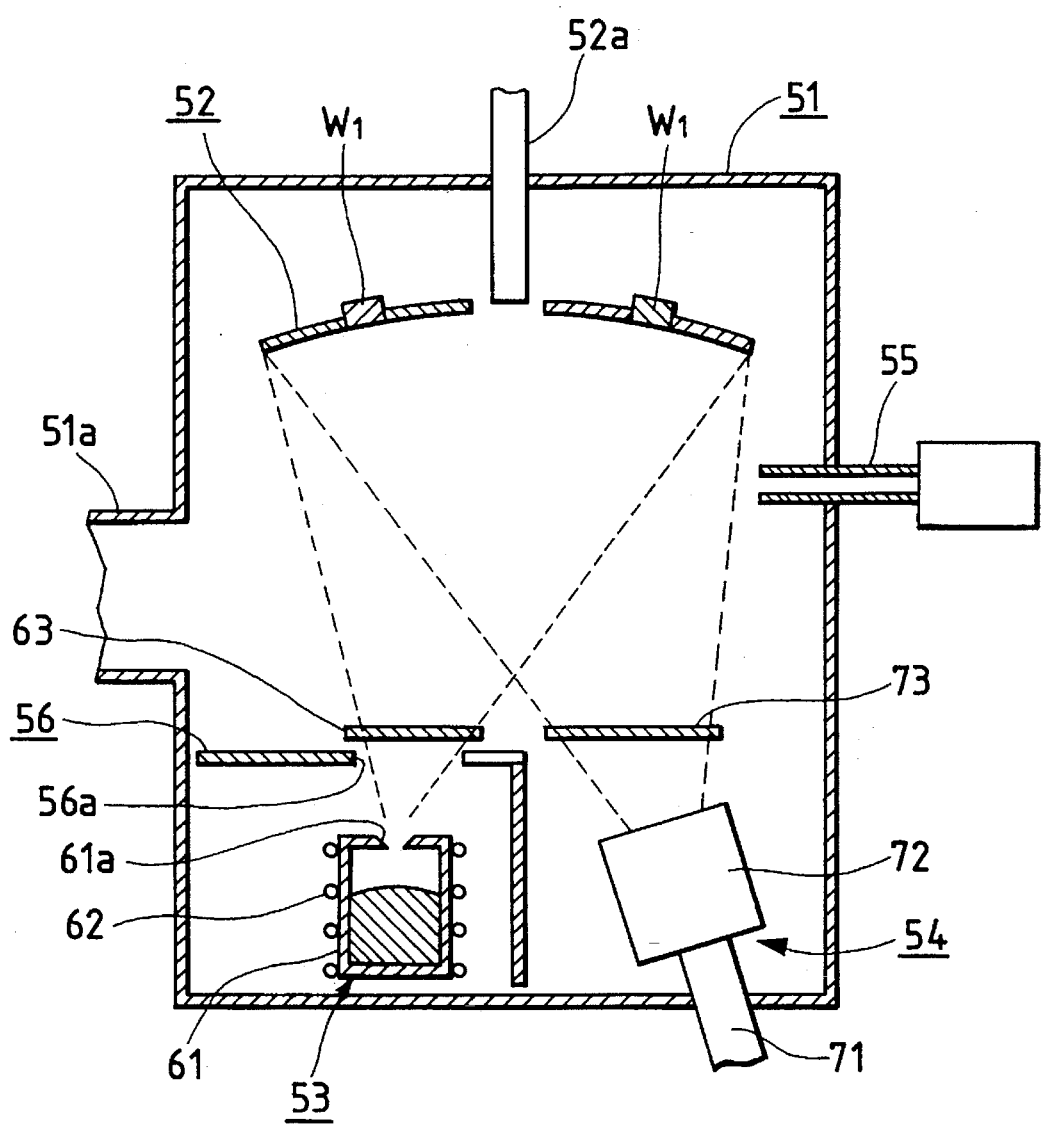
FIG. 12 is a schematic sectional view showing a cluster beam deposition apparatus used in a method of manufacturing a thin film according to each of the seventh to 12th embodiments.

FIG. 12 is a schematic sectional view for explaining a cluster beam deposition apparatus used in a thin film manufacturing method according to the seventh to 12th embodiments. The apparatus comprises a vacuum chamber 51 which is evacuated by a vacuum pump (not shown) connected to an evacuation port 51a, a dome-shaped substrate holder 52 arranged in the chamber 51, a cluster beam vapor source 53 arranged in a lower portion of the chamber 51, an ion source 54 for ionizing an inert gas, a reactive gas, or a mixture of these gases, and a gas supply line 55 as a gas supply means. The substrate holder 52 holds a plurality of substrates $W_1$, and is rotated by a rotation device (not shown). The film thickness of a thin film formed on each substrate $W_1$ is monitored by a film thickness monitor 52a.

The cluster beam vapor source 53 comprises a sealed crucible 61 having a nozzle 61a with an upward opening, and storing a thin film material therein, a heating coil 62 wound around the crucible 61, and a shutter 63 which can freely shield the vapor flow injected from the nozzle 61a toward each substrate $W_1$. The ion source 54 comprises a gas supply line 71 for supplying a reactive gas, an inert gas, or a mixture of these gases to the source 54, an RF excitation type ionization device 72 for ionizing the gas supplied via the line 71, a neutralizer (not shown) for neutralizing the ionized gas generated by the ionization device and a shutter 73 which can freely shield the gas flow irradiated from the ionization device 72 toward each substrate $W_1$. The cluster beam vapor source 53 is surrounded by an anti-deposition wall 56 as a shield means having an opening 56a which allows only the vapor flow to pass therethrough. The anti-deposition wall 56 prevents scattered particles reflected by the inner wall and the like of the vacuum chamber 51 from being incident on the substrates $W_1$ to lower film quality. Note that a plurality of cluster beam vapor sources 53 and ion sources 54 may be arranged as needed.

In the cluster beam deposition apparatus, a thin film material in the sealed crucible 61 is heated and evaporated by the heating coil 62, and is injected from the nozzle 61a into an atmospheric pressure so as to be clustered. The clustered particles are irradiated onto each substrate $W_1$ in an electrically neutral state without being ionized by an ionization means together with the ionized gas generated by the ion source 54. Note that the gas supply line 55 is used only when a reactive gas is supplied into the vacuum chamber 51 without being ionized so as to be reacted with cluster particles (the ninth embodiment).

(Seventh Embodiment)

Using the cluster beam deposition apparatus shown in FIG. 12, an Al thin film having a thickness of about 100 nm was formed on the surface of a BK7 glass substrate. After Al was set as a thin film material in the cluster beam vapor source 53 and the vacuum chamber 51 was evacuated to $1\times10^{-4}$ Pa, the Al material was heated and evaporated, and was injected from the nozzle 61a into a vacuum atmosphere so as to be clustered. The clustered particles were irradiated onto a substrate in an electrically neutral state without being ionized. At the same time, Ar gas as an inert gas was supplied to the ion source 54, and ionized Ar gas was irradiated onto the substrate as an ion assist. The ion assist acceleration voltage was controlled to 200 V, the ion current density was controlled to about 10 $\mu$A/cm$^2$, the atmospheric pressure in the vacuum chamber 51 during the film formation was about $1\times10^{-2}$ Pa, and the film formation rate (deposition rate) was about 3 nm/sec. Also, each substrate was not heated during the film formation.

When the adhesion and wear resistance of the formed Al film immediately after the film formation were evaluated by a known tape test and a Silbond paper rubbing test, the evaluation results were very good. In addition, the evaluation results of the adhesion and wear resistance by the same tests after an environmental resistance test in which the film was left to stand for 100 hours in a high-temperature/high-humidity state (70° C., 85%) were also good. Furthermore, upon examination of the reflectivities immediately after the film formation and after the environmental resistance test, it was found that a decrease in reflectivity at a wavelength of 500 nm after the environmental test was about 1%, and was very small. It is estimated that since clustered particles are deposited on a substrate without being ionized, damage to the substrate surface and charge-up of a thin film are prevented, and the adhesion and packing of the Al film are improved by the ion assist.

For the purpose of comparison, an Al film having the same thickness as that of the film of this embodiment was formed following substantially the same method as in the seventh embodiment, except that no ion assist was used and the atmospheric pressure in the vacuum chamber 51 during the film formation was about $1\times10^{-4}$ Pa, and the adhesion, wear resistance, and reflectivity immediately after the film formation and after the same environmental resistance test as above were measured. As a result, partial peeling and some scratches were observed on the Al film after the environmental resistance test, and the decrease in reflectivity after the environmental resistance test was 2%.

Table 7 below shows the examination results of the reflectivity, adhesion, and wear resistance immediately after the film formation and after the environmental resistance test while the Al film of this embodiment was defined as sample N-1, and an Al film of a comparative example was defined as sample N-2.

TABLE 7

| | Immediately After Film Formation | | | After Environmental Resistance Test | | |
|---|---|---|---|---|---|---|
| Sample Name | Reflectivity 500 nm | Adhesion 300 g 10 Times | Wear Resistance 300 g 50 times | Reflectivity 500 nm | Adhesion 300 g 10 Times | Wear Resistance 300 g 50 times |
| N-1 | 92% | Good | Good | 91% | Good | Good |
| N-2 | 92% | Good | Good | 90% | Partial Peeling of Periphery | Some Scratches |

(Eighth Embodiment)

Using the cluster beam deposition apparatus shown in FIG. 12, an MgF$_2$ film as an optical thin film having a thickness of about 90 nm was formed on the surface of a BK7 glass substrate.

MgF$_2$ was used as a thin film material in the cluster beam vapor source 53, and Ar gas as an inert gas and N$_2$ gas were supplied to the ion source 54 to generate an ion assist of the mixture of the Ar and N$_2$ gases. The ion assist acceleration voltage was 200 V, the ion current density was about 10 $\mu$A/cm$^2$, the atmospheric pressure in the vacuum chamber 51 during film formation was about $1\times10^{-2}$ Pa, the film formation rate was about 0.5 nm/sec, and each substrate was not heated.

When the reflectivity, adhesion, and wear resistance immediately after the film formation and after the environmental resistance test were examined in the same manner as described above, the adhesion and wear resistance were very good, neither peeling nor scratches after the environmental resistance test were observed, and the wavelength shift of a minimal value of the reflectivity after the environmental resistance test was about 1 nm or less. Furthermore, when the loss (transmittance) immediately after the film formation and after the environmental resistance test was examined, the loss was about 0.2% at a wavelength of 500 nm, and did not increase after the environmental resistance test. However, as the Ar gas content increased, the loss tended to increase.

For the purpose of comparison, an MgF$_2$ film having the same thickness as that of the film of this embodiment was formed following substantially the same method as in the eighth embodiment, except that no ion assist was used and the atmospheric pressure in the vacuum chamber 51 during the film formation was about $1\times10^{-4}$ Pa, and the adhesion, wear resistance, and reflectivity immediately after the film formation and after the environmental resistance test were measured. As a result, the wavelength shift of a minimal value of the reflectivity after the environmental resistance test as about 2 to 5 nm. Also, peeling and scratches were observed on the MgF$_2$ film after the environmental resistance test. This suggests that when clustered particles are deposited on a substrate without being ionized, use of the ion assist helps to greatly improve the adhesion and packing.

Table 8 below shows the examination results of the wavelength shift, adhesion, and wear resistance immediately after the film formation and after the environmental resistance test while the MgF$_2$ film of this embodiment was defined as sample O-1, and an MgF$_2$ film of a comparative example was defined as sample O-2.

TABLE 8

| | Immediately After Film Formation | | | After Environmental Resistance Test | |
|---|---|---|---|---|---|
| Sample Name | Adhesion 300 g 10 Times | Wear Resistance 300 g 50 Times | Wavelength Shift | Adhesion 300 g 10 Times | Wear Resistance 300 g 50 times |
| O-1 | Good | Good | 1 nm or less | Good | Good |
| O-2 | Good | Good | 2 to 5 nm | Partial Peeling of Periphery | Some Scratches |

(Ninth Embodiment)

Using the cluster beam deposition apparatus shown in FIG. 12, a TiO$_2$ film having a thickness of about 100 nm was formed on the surface of a BK7 glass substrate.

Ti$_2$O$_3$ was used as a thin film material, O$_2$ gas as a reactive gas was supplied from the gas supply line 55, and the ion source 54 was not used. After the interior of the vacuum chamber 51 was evacuated to $1\times10^{-4}$ Pa, $O_2$ gas was supplied from the gas supply line 55 to control the atmospheric pressure in the vacuum chamber 51 to be $1\times10^{-2}$ Pa. During the film formation, the film formation rate was about 0.2 nm/sec, and the substrate was not heated. When the reflectivity, adhesion, and wear resistance immediately after the film formation and after the environmental resistance test were examined in the same manner as described above, the wavelength shift of a minimal value of the reflectivity after the environmental resistance test was about 1 nm or less, and neither peeling nor scratches were visually observed after the environmental resistance test, and only a fine stripe-shaped scratch was observed via a ×100 microscope. Furthermore, when the loss immediately after the film formation and after the environmental resistance test was examined, the loss was very small, i.e., about 0.3% at a wavelength of 500 nm, and did not increase after the environmental resistance test.

Figure 1:
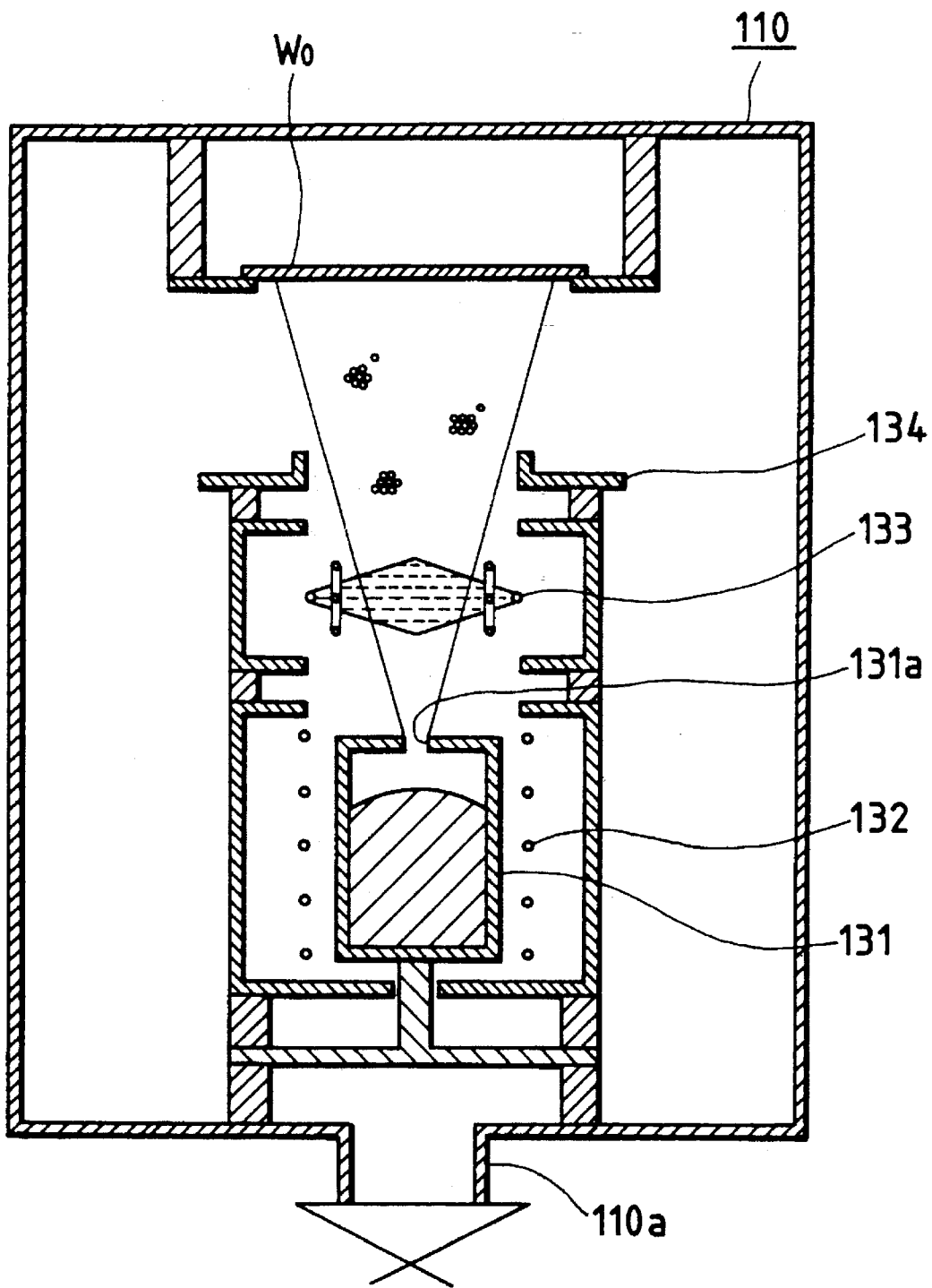
FIG. 1 is a schematic view showing a conventional cluster ion beam deposition apparatus.

For the purpose of comparison, a $TiO_2$ film having the same thickness as that of the film of this embodiment was formed on the same substrate using $Ti_2O_3$ as a thin film material and $O_2$ gas as a reactive gas and using a cluster ion beam deposition apparatus shown in FIG. 1. The ionization voltage of an ionization filament for ionizing cluster particles was controlled to 100 V, the ion current was controlled to 200 mA, and the acceleration voltage was controlled to 500 V. In addition, the atmospheric pressure in the vacuum chamber during film formation was controlled to about $1\times10^{-2}$ Pa, and the film formation rate was controlled to about 0.2 nm/sec. Furthermore, the substrate was not heated.

Upon examination of the reflectivity, adhesion, wear resistance, and loss immediately after the film formation and after the environmental resistance test, substantially the same results as those of the $TiO_2$ film according to the ninth embodiment were obtained. However, the service lives of the ionization filament for ionizing cluster particles and a heating bombard filament were very short: when the cluster beam deposition apparatus was operated for about 200 hours, an abnormality of the filament voltage was observed, and after about 300 hours, the apparatus became inoperable. This is because the ionization filament and the heating bombard filament are corroded by the reactive gas, and their performance has deteriorated.

According to this embodiment, since no ionization filament for ionizing cluster particles is required, the apparatus arrangement is simple, and a $TiO_2$ film as a compound thin film can be easily manufactured with low cost.

(10th Embodiment)

Using the cluster beam deposition apparatus shown in FIG. 12, a $TiO_2$ film as an optical thin film having a thickness of 100 nm was manufactured following substantially the same procedures as in the ninth embodiment, except that $O_2$ gas as a reactive gas and Ar gas as an inert gas were supplied from the gas supply line 55 to the ion source 54 in place of supplying $O_2$ gas, and a reactive ion assist consisting of a gas mixture of ionized $O_2$ gas and Ar gas was used.

The Ar gas content in the gas mixture was about 30%, the acceleration voltage of the reactive ion assist was 750 V, the ion current density was about 10 $\mu A/cm^2$, the atmospheric pressure upon film formation was $10^{-2}$ Pa, the film formation rate was about 0.2 nm/sec, and a substrate was not heated.

When the reflectivity, adhesion, and wear resistance immediately after the film formation and after the environmental resistance test were examined, the examination results were very good, and the wavelength shift of a minimal value of the reflectivity after the environmental resistance test was about 1 nm or less. Furthermore, when the loss immediately after the film formation and after the environmental resistance test was examined, the loss was very small, i.e., about 0.3% at a wavelength of 500 nm, and did not increase after the environmental resistance test.

For the purpose of comparison, the same $TiO_2$ film was formed using the reactive ion assist of this embodiment in a cluster ion beam deposition apparatus shown in FIG. 1. The acceleration voltage of ionized cluster particles was 500 V, the ionization voltage was 100 V, the ionization current was 200 mA, the acceleration voltage of the reactive ion assist was 750 V, the ionization current density was about 10 $\mu A/cm^2$, the atmospheric pressure during film formation was $1\times10^{-2}$ Pa, the film formation rate was about 0.2 nm/sec, and a substrate was not heated. On the surface of the formed $TiO_2$ film, a considerable damage such as a mark of abnormal discharging assumed to be caused by charge-up during the film formation was observed since cluster particles are ionized and the reactive ion assist was used. However, since the reactive gas was ionized and was given with directivity to avoid the ionization filament, the apparatus could be operated for a considerably longer period of time than the comparative example of the ninth embodiment.

It is analogized from these results that when a heating bombard filament is used in place of a coil for heating a crucible in a cluster ion beam deposition apparatus, deterioration of the heating bombard filament can be effectively prevented by ionizing the reactive gas.

(11th Embodiment)

Using the cluster beam deposition apparatus shown in FIG. 12, an SiN film as an optical thin film having a thickness of about 100 nm was formed on the surface of a BK7 glass substrate.

The film formation conditions of this embodiment are substantially the same as those in the seventh embodiment, except that a reactive ion assist using $N_2$ gas as a reactive gas was used in place of an ion assist of Ar gas. In this embodiment, the acceleration voltage of the reactive ion assist was 200 V, the ion current density was about 10 $\mu A/cm^2$, the atmospheric pressure during film formation was about $1\times10^{-2}$ Pa, the film formation rate was about 0.5 nm/sec, and the substrate was not heated.

When the reflectivity, adhesion, and wear resistance immediately after the film formation and after the environmental resistance test were examined, the examination results were very good, the wavelength shift of a minimal value of the reflectivity after the environmental resistance test was about 2 nm or less, and neither peeling nor scratches after the environmental resistance test were observed. Furthermore, when the loss immediately after the film formation and after the environmental resistance test was examined, the loss was very small, i.e., about 0.5% or less at a wavelength of 800 nm, and did not increase after the environmental resistance test.

The SiN film of this embodiment was formed on a GdTbFe three-element magnetooptical film formed by a sputtering method using another apparatus to obtain sample P–1, and for the purpose of comparison, an SiN film was subsequently formed on a GdTbFe three-element magnetooptical film similarly formed by the sputtering method to obtain sample P–2. Table 9 below shows the examination results of the coercive force and outer appearance of these samples immediately after the film formation and after the environmental resistance test.

TABLE 9

| Sample Name | Immediately After Film Formation | After Environmental Resistance Test | |
|---|---|---|---|
| | Coercive Force (Oe) | Coercive Force (Oe) | Outer Appearance (×100 Microscope) |
| P-1 | 1300 | 1230 | Good |
| P-2 | 1400 | 1340 | Good |

As can be seen from Table 9, the SiN film as a compound thin film according to this embodiment has no large difference from that obtained by the sputtering method in terms of outer appearance and performance.

The method of this embodiment is more advantageous than the sputtering method in that the film formation rate is higher and film formation can be realized on a substrate with a larger area.

(12th Embodiment)

Two pairs of cluster beam vapor sources and ion sources were arranged in the cluster beam deposition apparatus shown in FIG. 12, Si was used as a thin film material of one cluster beam vapor source, and Al was used as a thin film material of the other cluster beam vapor source. One ion source generated a reactive ion assist of $N_2$ gas as a reactive gas, and the other ion source generated a reactive ion assist of $O_2$ gas as a reactive gas, thereby forming an SiAlON film as an optical thin film on the surface of a BK7 glass substrate. The acceleration voltage of the reactive ion assist of $N_2$ gas was 200 V, the ion current density thereof was about 10 µA/cm², the acceleration voltage of the reactive ion assist of $O_2$ gas was 150 V, the current density thereof was about 8 µA/cm², the atmospheric pressure during the film formation was about $1.2 \times 10^{-2}$ Pa, the film formation rate was about 0.3 nm/sec, and the substrate was not heated.

The refractive index of the formed SiAlON film was 1.9 immediately after the film formation, and corresponded to an intermediate value between those of an SiN film and an $Al_2O_3$ film. Upon examination of the reflectivity, adhesion, and wear resistance immediately after the film formation and after the environmental resistance test, the examination results were very good, the wavelength shift of a minimal value of the reflectivity after the environmental resistance test was about 2 nm or less, and neither peeling nor scratches were observed. Furthermore, when the loss immediately after the film formation and after the environmental resistance test was examined, the loss was very small, i.e., about 0.2% or less at a wavelength of 800 nm, and did not increase after the environmental resistance test.

When a plurality of ion sources are used like in this embodiment, a thin film being formed may be damaged by charge-up. However, such a damage can be avoided by properly controlling the ion sources.

In the same manner as an oxynitride thin film such as an SiAlON film as a compound thin film, for example, carbide thin films such as a TiC film, SiC film, and the like; nitride thin films such as a ZrN film, AlN film, and the like; carbonitride thin films such as a TaCN film, and the like; and the like can be formed, as a matter of course.

Note that the seventh to 12th embodiments have exemplified a method of manufacturing an optical thin film. However, a thin film manufacturing method and apparatus of the present invention can be applied to thin films other than an optical thin film, as a matter of course.

The thin film apparatus of the present invention described above has the following arrangement.

Cluster particles generated by the cluster beam vapor source 53 are irradiated onto each substrate $W_1$ in an electrically neutral state without being ionized. At the same time, the ion source 54 irradiates an ionized inert gas, reactive gas, or mixture of these gases to each substrate $W_1$ as an ion assist, thereby improving the adhesion and packing of a thin film formed on each substrate $W_1$.

Since the present invention has the above-mentioned arrangement, the following effects are expected.

A thin film having high durability, optical characteristics, and the like can be easily manufactured at a relatively low temperature.

According to the present invention, since cluster particles are irradiated onto a substrate together with an ion assist in place of being ionized, a thin film having high durability, optical characteristics, and the like can be formed.

According to the present invention, a compound thin film can be easily manufactured with low cost at a relatively low temperature.

What is claimed is:

1. A thin film manufacturing method comprising the steps of:

clustering evaporated particles generated by a vapor source; and depositing the clustered evaporated particles onto a substrate in a vacuum atmosphere without ionizing the particles, wherein a partial pressure of water vapor in the vacuum atmosphere is controlled to not more than $5 \times 10^{-6}$ Torr.

2. A method according to claim 1, wherein a temperature of the substrate is maintained to be not exceeding 150° C.

3. A method according to claim 1, wherein the substrate consists of a plastic material.

4. A method according to claim 1, wherein the substrate is a fluorite substrate.

5. A thin film manufacturing method comprising the steps of:

clustering evaporated particles generated by a vapor source of a fluoride; and depositing the clustered evaporated particles onto a substrate in a vacuum atmosphere without ionizing the particles, wherein a partial pressure of water vapor in the vacuum atmosphere is controlled to not exceeding $5 \times 10^{-6}$ Torr.

6. A method according to claim 5, wherein the fluoride is one member selected from the group consisting of $MgF_2$, $LaF_3$, $LiF$, $NdF_3$, $BaF_2$, $SrF_2$, $NaF$, $AlF_3$, and $Na_3AlF_6$.

* * * * *

UNITED STATES PATENT AND TRADEMARK OFFICE
CERTIFICATE OF CORRECTION

PATENT NO. : 5,582,879

DATED : December 10, 1996

INVENTORS : HIDEHIKO FUJIMURA ET AL.

Page 1 of 2

It is certified that error appears in the above-identified patent and that said Letters Patent is hereby corrected as shown below:

ON TITLE PAGE

[57] ABSTRACT

Line 5, "atmoshpere" should read --atmosphere--;
    Line 8, "characteristics" should read --characteristic--.

COLUMN 5

Line 42, "reflectively" should read --reflectivity--.

COLUMN 7

Line 25, "were" should read --was--.

UNITED STATES PATENT AND TRADEMARK OFFICE
CERTIFICATE OF CORRECTION

PATENT NO. : 5,582,879

DATED : December 10, 1996

INVENTORS : HIDEHIKO FUJIMURA ET AL.

It is certified that error appears in the above-identified patent and that said Letters Patent is hereby corrected as shown below:

COLUMN 8

Line 30, "50m-nm" should read --50nm--;
Line 48, "$1 \times 10^{-6}$ Torr" should read --$1 \times 10^{-5}$ Torr--.

Signed and Sealed this

Seventeenth Day of June, 1997

Attest:

BRUCE LEHMAN

Attesting Officer

Commissioner of Patents and Trademarks